(12) United States Patent
Taghivand

(10) Patent No.: US 8,791,763 B2
(45) Date of Patent: Jul. 29, 2014

(54) TUNABLE INJECTION LOCKED DIVIDERS WITH ENHANCED LOCKING RANGE

(75) Inventor: Mazhareddin Taghivand, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/570,933

(22) Filed: Aug. 9, 2012

(65) Prior Publication Data

US 2014/0043103 A1 Feb. 13, 2014

(51) Int. Cl.
*H03L 7/18* (2006.01)

(52) U.S. Cl.
USPC .............. 331/16; 331/57; 331/34; 331/177 R; 327/115; 327/172

(58) Field of Classification Search
USPC .................. 331/16, 34, 177 R, 57, 179, 36 C; 327/115, 172
See application file for complete search history.

(56) References Cited

U.S. PATENT DOCUMENTS

| | | | |
|---|---|---|---|
| 4,347,484 | A | 8/1982 | Vandegraaf |
| 7,348,818 | B2 | 3/2008 | Hulfachor et al. |
| 7,671,640 | B2 * | 3/2010 | Lee et al. ................... 327/115 |
| 7,830,212 | B2 | 11/2010 | Lee et al. |
| 7,856,212 | B2 | 12/2010 | Pellerano et al. |
| 7,952,438 | B2 | 5/2011 | Song et al. |
| 2009/0102520 | A1 * | 4/2009 | Lee et al. ................... 327/115 |
| 2012/0262239 | A1 | 10/2012 | Taghivand et al. |
| 2013/0141146 | A1 | 6/2013 | Shima |

FOREIGN PATENT DOCUMENTS

| | | |
|---|---|---|
| WO | 03107536 A2 | 12/2003 |
| WO | 2013002873 | 1/2013 |

OTHER PUBLICATIONS

Wilson, W.B. et al., "A CMOS self-calibrating frequency synthesizer," IEEE Journal of Solid-State Circuits, 35(10), Oct. 2000, pp. 1437-1444. See Abstract, section I: Introduction, section III: Design of Oscillator and PLL, section IV: Self-Calibration Algorithm and Implementation, and figure 9.
Betancourt-Zamora R.J., "Injection-Locked Ring Oscillator Frequency Dividers", Mar. 1, 2005, XP055084082, Retrieved from the Internet: <URL: http://betasoft.org/wordpress/wp-content/uploads/2011/ll/thesis.pdf>, [retrieved on Oct. 15, 2013] A p. 103-p. 106; figures 5-17.
Betancourt-Zamora R.J., "Injection-Locked Ring Oscillator Frequency Dividers", Mar. 1, 2005, XP055084087, Retrieved from the Internet: <URL: searchworks.stanford.edu/view/5977820>, [retrieved on Oct. 15, 2013].
International Search Report and Written Opinion—PCT/US2013/054186—ISA/EPO—Oct. 23, 2013.

* cited by examiner

*Primary Examiner* — Arnold Kinkead
(74) *Attorney, Agent, or Firm* — Kenyon S. Jenckes

(57) ABSTRACT

Tunable injection locked (IL) dividers having enhanced locking range, good phase noise performance, and low power consumption are disclosed. In an exemplary design, an apparatus (e.g., a wireless device) includes an oscillator and at least one IL divider. The oscillator provides an oscillator signal at a first frequency. The at least one IL divider receives the oscillator signal and provides an output signal at a second frequency, which is related to the first frequency by an overall divider ratio for the IL divider(s). Each IL divider may be calibrated based on a target frequency of that IL divider. Each IL divider may be calibrated (e.g., by tuning at least one adjustable capacitor) to obtain an oscillation frequency within a predetermined tolerance of the target frequency of that IL divider. The oscillator may be calibrated based on a target oscillation frequency of the oscillator.

27 Claims, 10 Drawing Sheets

US 8,791,763 B2

TUNABLE INJECTION LOCKED DIVIDERS WITH ENHANCED LOCKING RANGE

BACKGROUND

I. Field

The present invention relates generally to circuits, and more specifically to injection locked (IL) dividers for frequency synthesis. IL dividers are also commonly referred to as IL frequency dividers (ILFDs), IL oscillators, etc.

II. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

The wireless device may include one or more phase-locked loops (PLLs) to generate one or more oscillator signals at one or more desired frequencies. The oscillator signal(s) may be used to generate the transmit LO signal for the transmitter and the receive LO signal for the receiver. The PLL(s) may be required to generate the oscillator signal(s) with good phase noise performance. The PLL(s) should also consume as little battery power as possible in order to extend battery life and prolong standby time and talk time of the wireless device.

SUMMARY

Tunable IL dividers having enhanced locking range, good phase noise performance, and low power consumption are disclosed herein. The tunable IL dividers may be used in PLLs, especially PLLs operating at very high frequencies, to obtain good performance and low power consumption.

In an exemplary design, an apparatus (e.g., a wireless device) may include an oscillator and at least one IL divider. The oscillator may provide an oscillator signal at a first frequency. The at least one IL divider may receive the oscillator signal at the first frequency and provide an output signal at a second frequency, which may be related to the first frequency by an overall divider ratio of the at least one IL divider. Each of the at least one IL divider may be calibrated based on a target frequency of each IL divider. Each IL divider may be calibrated (e.g., by tuning at least one adjustable capacitor) to obtain an oscillation frequency that is within a predetermined tolerance of the target frequency of the IL divider. The oscillator may also be calibrated based on a target oscillation frequency of the oscillator.

In one design, the at least one IL divider may include first and second IL dividers. Only the first IL divider may be selected and remaining IL divider(s) may not be selected when the first IL divider is being calibrated. The second IL divider and a first auxiliary divider associated with the first IL divider may be selected when the second IL divider is being calibrated. The first auxiliary divider and a second auxiliary divider associated with the second IL divider may be selected when the oscillator is being calibrated.

Various aspects and features of the disclosure are described in further detail below.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Tunable IL dividers having enhanced locking range and other desirable characteristics are disclosed herein. The tunable IL dividers may be used for various electronic devices such as wireless communication devices.

Figure 1:
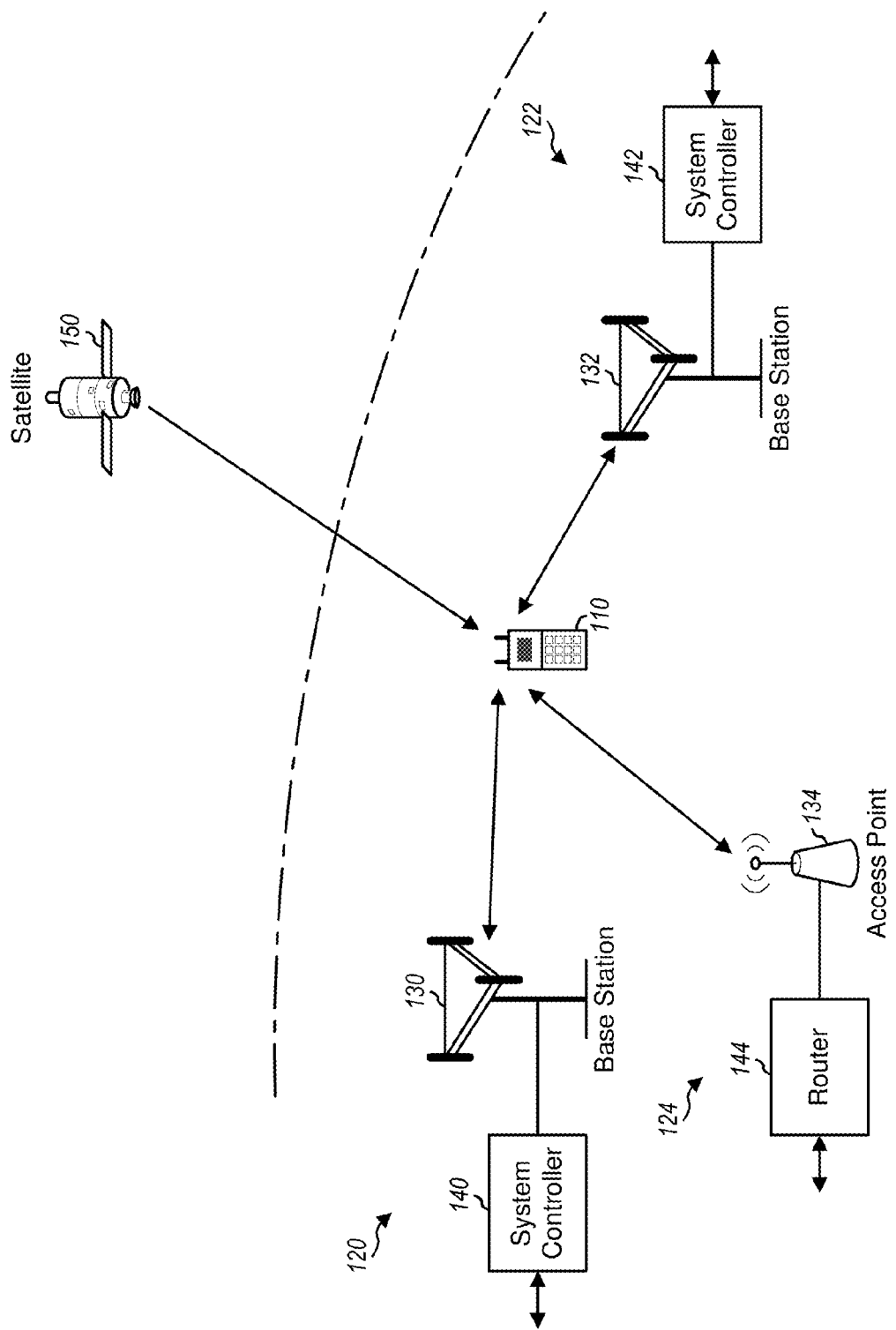
FIG. 1 shows a wireless device capable of communicating with different wireless communication systems.

FIG. 1 shows a wireless device 110 capable of communicating with different wireless communication systems 120, 122 and/or 124. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1X or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). Wireless system 124 may be a wireless local area network (WLAN) system, which may implement IEEE 802.11, Hiperlan, etc. For example, wireless system 124 may implement IEEE 802.11 for Very High Throughput (VHT) in 60 gigahertz (GHz) frequency band, which may cover 57 to 66 GHz.

For simplicity, FIG. 1 shows wireless system 120 including one base station 130 and one system controller 140, wireless system 122 including one base station 132 and one system controller 142, and wireless system 124 including one access point 134 and one router 144. In general, each wireless system may include any number of base stations/access points and any set of network entities. Each base station and each access point may support communication for wireless devices within its coverage.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120, 122 and/or 124. Wireless device 110 may also be capable of receiving signals from satellites (e.g., a satellite 150) in one or more global navigation satellite systems (GNSS). Wireless device 110 may support one or more radio technologies for wireless communication such as LTE, GSM, WCDMA, cdma2000, 802.11, etc.

Figure 2:
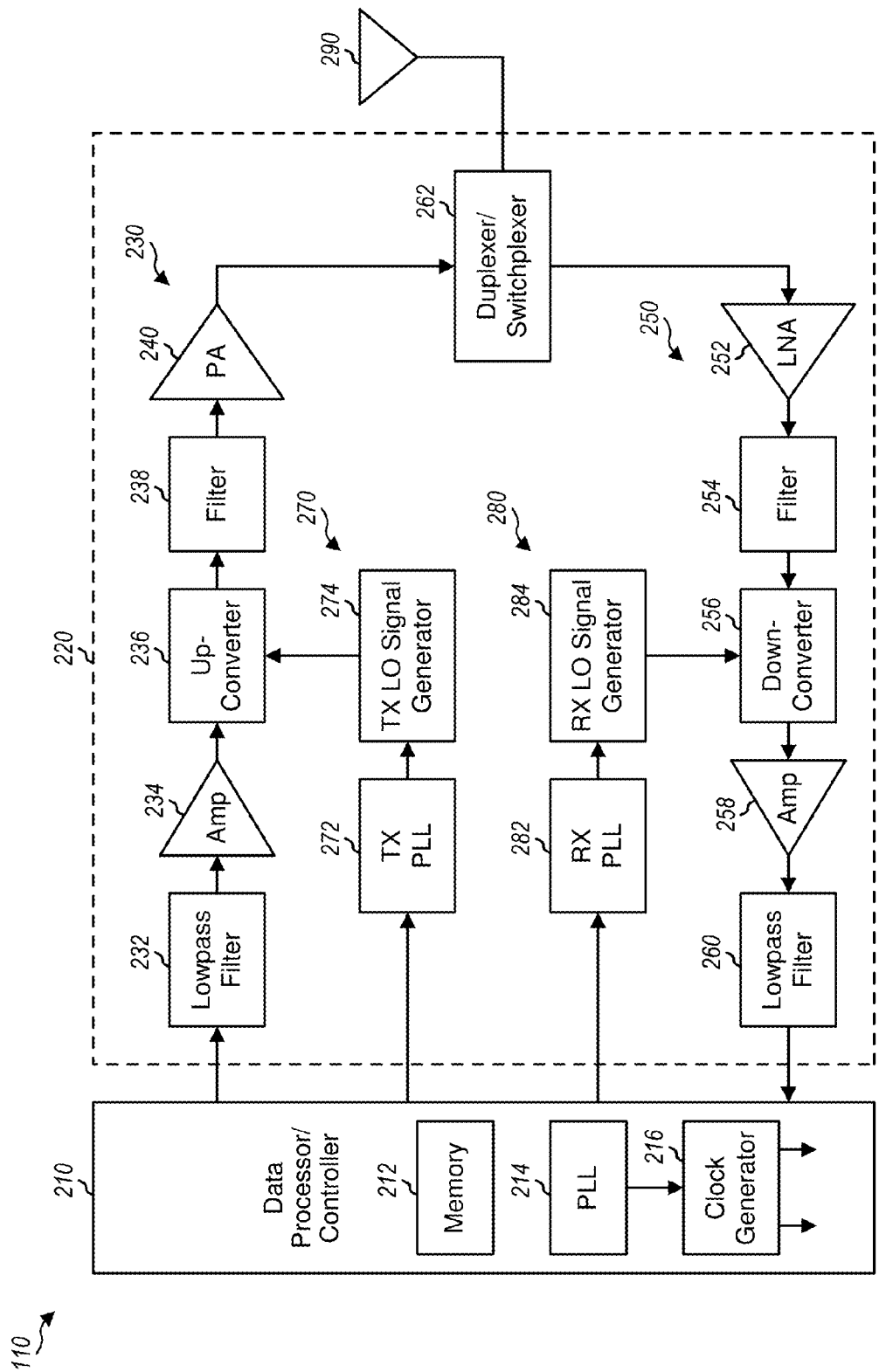
FIG. 2 shows a block diagram of the wireless device in FIG. 1.

FIG. 2 shows a block diagram of an exemplary design of wireless device 110 in FIG. 1. In this exemplary design, wireless device 110 includes a data processor/controller 210, a transceiver 220, and an antenna 290. Transceiver 220 includes a transmitter 230 and a receiver 250 that support bi-directional communication.

A transmitter or a receiver may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, transmitter 230 and receiver 250 are implemented with the direct-conversion architecture.

In the transmit path, data processor 210 may process (e.g., encode and modulate) data to be transmitted and provide an analog output signal to transmitter 230. Within transmitter 230, a lowpass filter 232 may filter the analog output signal to remove images caused by a prior digital-to-analog conversion. An amplifier (Amp) 234 may amplify the signal from lowpass filter 232 and provide an amplified baseband signal. An upconverter 236 may receive the amplified baseband signal and a transmit (TX) LO signal from an LO signal generator 274. Upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from filter 238 to obtain the desired output power level and provide an output RF signal. The output RF signal may be routed through a duplexer/switchplexer 262.

For FDD, transmitter 230 and receiver 250 may be coupled to duplexer 262, which may include a TX filter for transmitter 230 and a receive (RX) filter for receiver 250. The TX filter may filter the output RF signal to pass signal components in a transmit band and attenuate signal components in a receive band. For TDD, transmitter 230 and receiver 250 may be coupled to switchplexer 262. Switchplexer 262 may pass the output RF signal from transmitter 230 to antenna 290 during uplink time intervals. For both FDD and TDD, duplexer/switchplexer 262 may provide the output RF signal to antenna 290 for transmission via a wireless channel.

In the receive path, antenna 290 may receive signals transmitted by base stations, access points, and/or other transmitter stations and may provide a received RF signal. The received RF signal may be routed through duplexer/switchplexer 262. For FDD, the RX filter within duplexer 262 may filter the received RF signal to pass signal components in a receive band and attenuate signal components in the transmit band. For TDD, switchplexer 262 may pass the received RF signal from antenna 290 to receiver 250 during downlink time intervals. For both FDD and TDD, duplexer/switchplexer 262 may provide the received RF signal to receiver 250.

Within receiver 250, the received RF signal may be amplified by a low noise amplifier (LNA) 252 and filtered by a filter 254 to obtain an input RF signal. A downconverter 256 may receive the input RF input signal and an RX LO signal from an LO signal generator 284. Downconverter 256 may downconvert the input RF signal with the RX LO signal and provide a downconverted signal. The downconverted signal may be amplified by an amplifier 258 and further filtered by a lowpass filter 260 to obtain an analog input signal, which may be provided to data processor 210.

A frequency synthesizer 270 may generate the TX LO signal for frequency upconversion and may include a PLL 272 and LO signal generator 274. PLL 272 may receive timing information from data processor/controller 210 and may generate a TX VCO signal at a desired frequency. LO signal generator 274 may receive the TX VCO signal and generate the TX LO signal. A frequency synthesizer 280 may generate the RX LO signal for frequency downconversion and may include a PLL 282 and LO signal generator 284. PLL 282 may receive timing information from data processor/controller 210 and may generate an RX VCO signal at a desired frequency. LO signal generator 284 may receive the RX VCO signal and generate the RX LO signal. PLLs 272 and 282 may each be implemented as described below. LO generators 274 and 284 may each include frequency dividers, buffers, etc. Each VCO signal and each LO signal may be a periodic signal with a particular fundamental frequency. The TX LO signal and the RX LO signal from LO generators 274 and 284 may have (i) the same frequency for TDD or (ii) different frequencies for FDD. The TX VCO signal and the RX VCO signal from VCOs 272 and 282 may have the same frequency (e.g., for TDD) or different frequencies (e.g., for FDD or TDD).

FIG. 2 shows an exemplary design of transmitter 230 and receiver 250. In general, the conditioning of the signals in a transmitter and a receiver may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter and receiver. For example, impedance matching circuits may be located at the output of PA 240, at the input of LNA 252, between antenna 290 and duplexer/switchplexer 262, etc. Some circuits in FIG. 2 may also be omitted. For example, filter 238 and/or 254 may be omitted.

All or a portion of transceiver 220 may be implemented on one or more analog integrated circuits (ICs), RF ICs (RFICs), mixed-signal ICs, etc. For example, lowpass filter 232 to PA 240 in transmitter 230, LNA 252 to lowpass filter 260 in receiver 250, PLLs 272 and 282 and LO generators 274 and 284 may be implemented on an RFIC. PA 240 and possibly other circuits may also be implemented on a separate IC or circuit module.

Data processor/controller 210 may perform various functions for wireless device 110. For example, data processor 210 may perform processing for data being transmitted via transmitter 230 and received via receiver 240. Controller 210 may control the operation of various circuits within transmitter 230 and receiver 250. Memory 212 may store program codes and data for data processor/controller 210. Memory 212 may be internal to data processor/controller 210 (as shown in FIG. 2) or external to data processor/controller 210 (not shown in FIG. 2). A PLL 214 may generate a VCO signal at a particular frequency. A clock generator 216 may receive the VCO signal from PLL 214 and may generate clock signals for various modules within data processor/controller 210. Data processor/controller 210 may be implemented on one or more application specific integrated circuits (ASICs) and/or other ICs.

Figure 3:
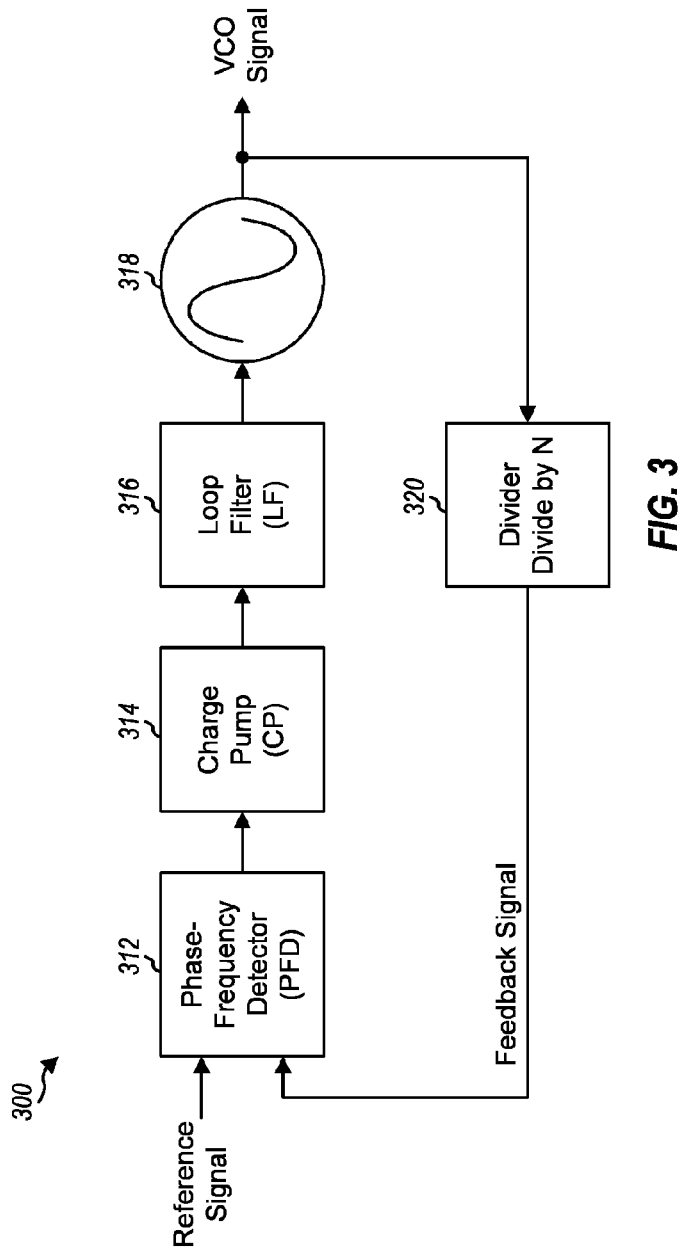
FIG. 3 shows a block diagram of a conventional PLL.

FIG. 3 shows a block diagram of a conventional PLL 300, which may be used for each of PLLs 272, 282, and 214 in FIG. 2. PLL 300 includes a phase-frequency detector (PFD) 312, a charge pump (CP) 314, a loop filter (LF) 316, a VCO 318, and a divider 320. VCO 318 generates a VCO signal having a frequency that is determined by a control voltage from loop filter 316. Divider 320 divides the VCO signal by a factor of N in frequency, where N≥1, and provides a feedback signal. Phase-frequency detector 312 receives a reference signal at a reference frequency and the feedback signal, compares the phases of the two signals, and provides a detector signal that indicates the phase difference/error between the two signals. Charge pump 314 generates an error signal that is proportional to the detected phase error. Loop filter 316 filters the error signal and provides the control voltage for VCO 318. Loop filter 316 adjusts the control voltage such that the phase or frequency of the feedback signal is locked to the phase or frequency of the reference signal. Loop filter 316 may be designed with a suitable frequency response to obtain the desired characteristics for PLL 300, e.g., the desired pull-in range, locking range, settling time, closed-loop bandwidth, etc.

Some major considerations for the design of a PLL are phase noise performance and power consumption. It may be challenging to design a high frequency PLL with good phase noise performance and low power consumption. For example, a PLL may be required to operate at 60 GHz to support communication with a WLAN system in IEEE 802.11 VHT. One way to obtain a 60 GHz PLL is to have a VCO operates at 60 GHz, divide a VCO signal in frequency by a suitable divider ratio with a "static" divider to obtain an intermediate signal at a much lower frequency, and then divide the intermediate signal with a prescaler. A static divider is a divider that can divide an input signal in frequency but cannot generate a time-varying output signal without an input signal. A divider ratio of 16 may be a good choice for the static divider for a 60 GHz VCO signal. However, the static divider may consume a lot of power and may also adversely affect phase noise performance of the PLL.

One solution to the problems associated with a static divider is to use an IL divider in place of the static divider. An IL divider is an oscillator that can receive (i.e., be injected with) an input signal at a frequency that is around an integer multiple of a free-running oscillation frequency of the IL divider. The IL divider may then injection lock to the input signal and effectively divide down the input signal to the free-running oscillation frequency of the IL divider. However, IL dividers typically have very limited locking range. In particular, if the frequency of an input signal injected into an IL divider is not within a locking range of the IL divider, then the IL divider would not lock to the input signal and consequently would not divide down the input signal in frequency. The limited locking range of IL dividers makes the use of IL dividers not robust over variations in integrated circuit (IC) process, voltage, and temperature (PVT). Hence, IL dividers may not be suitable for mass production in many cases.

In an aspect of the present disclosure, one or more tunable IL dividers having enhanced locking range may be used for frequency synthesis to obtain good phase noise performance and low power consumption. A tunable IL divider may have one or more characteristics (e.g., capacitance, inductance, and/or current) that can be adjusted to tune an oscillation frequency of the IL divider. In one design, a tunable IL divider with enhanced locking range may be tuned by (i) estimating the free-running oscillation frequency of the IL divider to a desired accuracy and (ii) tuning the oscillation frequency of the IL divider toward (e.g., within a certain tolerance of) a target oscillation frequency (or simply, a target frequency) of the IL divider. The IL divider may then be able to lock to an input signal at the target frequency even with its normally limited locking range. The enhanced locking range may thus be achieved by tuning/shifting the limited locking range of the IL divider toward the target frequency. The tunable IL divider may be used in a closed-loop circuit (e.g., in a PLL) or in an opened-loop circuit (e.g., outside a PLL).

Figure 4:
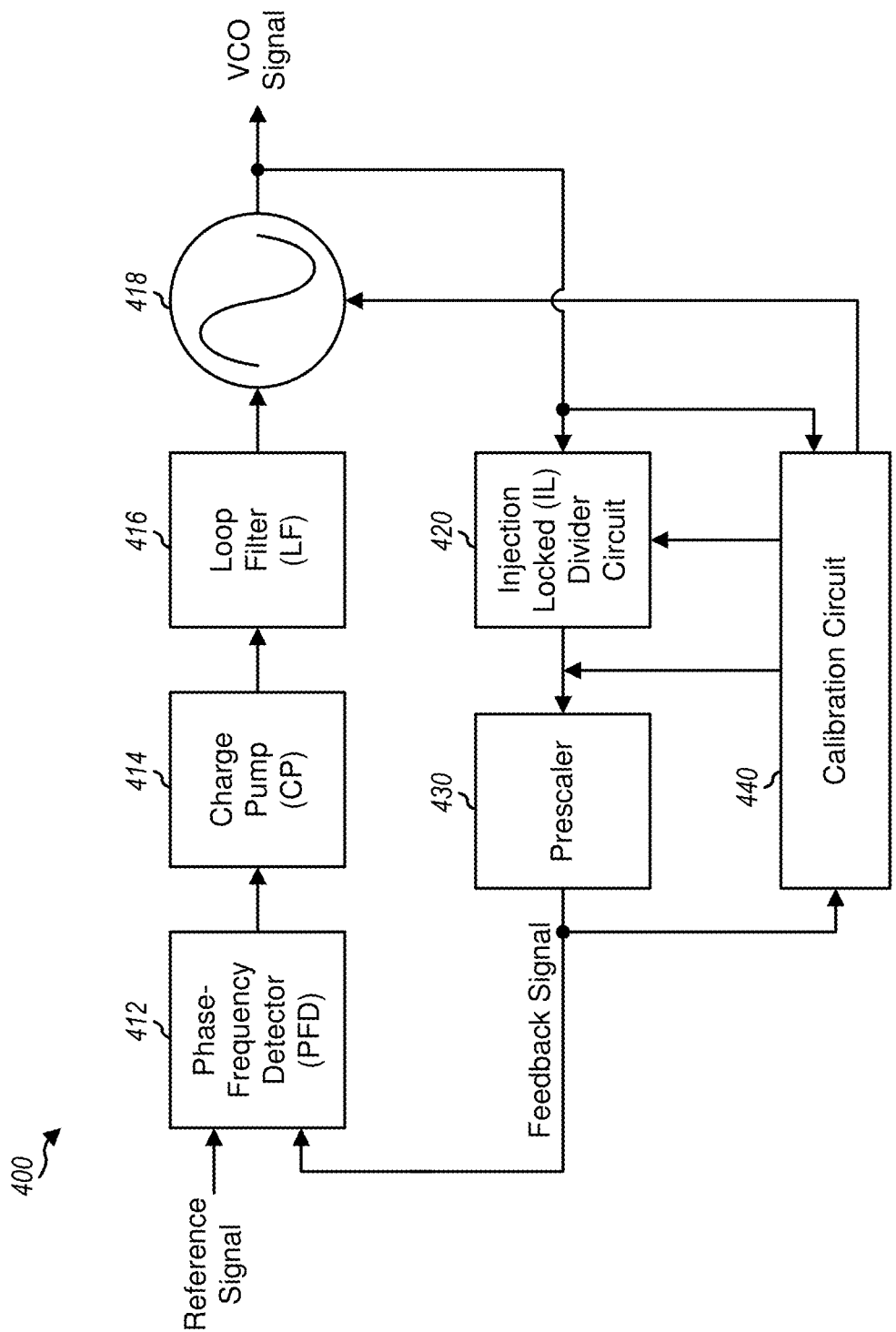
FIG. 4 shows a block diagram of a design of a novel PLL with one or more tunable IL dividers.

FIG. 4 shows a block diagram of an exemplary design of a PLL 400 with one or more tunable IL dividers. PLL 400 may be used for each of PLLs 272, 282, and 214 in FIG. 2. PLL 400 includes a phase-frequency detector 412, a charge pump 414, a loop filter 416, and a VCO 418, which may be coupled and operated in similar manner as phase-frequency detector 312, charge pump 314, loop filter 316, and VCO 318, respectively, in FIG. 3. VCO 418 may be replaced with a current-controlled oscillator (ICO), a digitally controlled oscillator (DCO), or some other type of oscillator. PLL 400 further includes an IL divider circuit 420 and a prescaler 430. IL divider circuit 420 may include one or more tunable IL dividers having enhanced locking range. IL divider circuit 420 may receive a VCO signal from VCO 418, divide the VCO signal in frequency by a particular divider ratio, and provide an intermediate signal. Prescaler 430 may receive the intermediate signal from IL divider circuit 420, divide the intermediate signal in frequency, and provide a feedback signal at a reference frequency to phase-frequency detector 412. IL circuit 420 may be considered as a first divider stage, and prescaler 430 may be considered as a second divider state.

A calibration circuit 440 may tune one or more IL dividers within IL divider circuit 420. In one design, calibration circuit 440 may measure the natural and unperturbed oscillation frequency of an IL divider and may adjust/tune the oscillation frequency of the IL divider toward a target frequency of the IL divider, as described below.

FIG. 4 shows an exemplary design of PLL 400, which may also be implemented in other manners. PLL 400 may include additional circuits not shown in FIG. 4. For example, PLL 400 may include a multi-modulus divider that can divide an input signal (e.g., the intermediate signal from IL divider circuit 420) by a configurable divider ratio, which may be an integer value or a non-value value. The multi-modulus divider may be coupled after prescaler 430 or may replace prescaler 430.

PLL 400 may also include a pre-divider, a post-divider, a no-clock detector, buffers, etc. PLL 400 may also include other circuits in place of one or more circuits shown in FIG. 4. For example, VCO 418 may be replaced with an ICO, a DCO, etc. Charge pump 414 and loop filter 416 may be replaced with a digital loop filter that can generate a digital control for a DCO. Some circuits in FIG. 4 may also be omitted from PLL 400. For example, prescaler 430 may be omitted, and IL divider circuit 420 may provide the feedback signal at the reference frequency. The circuits in FIG. 4 may also be arranged in a different order than the order shown in FIG. 4.

Figure 5:
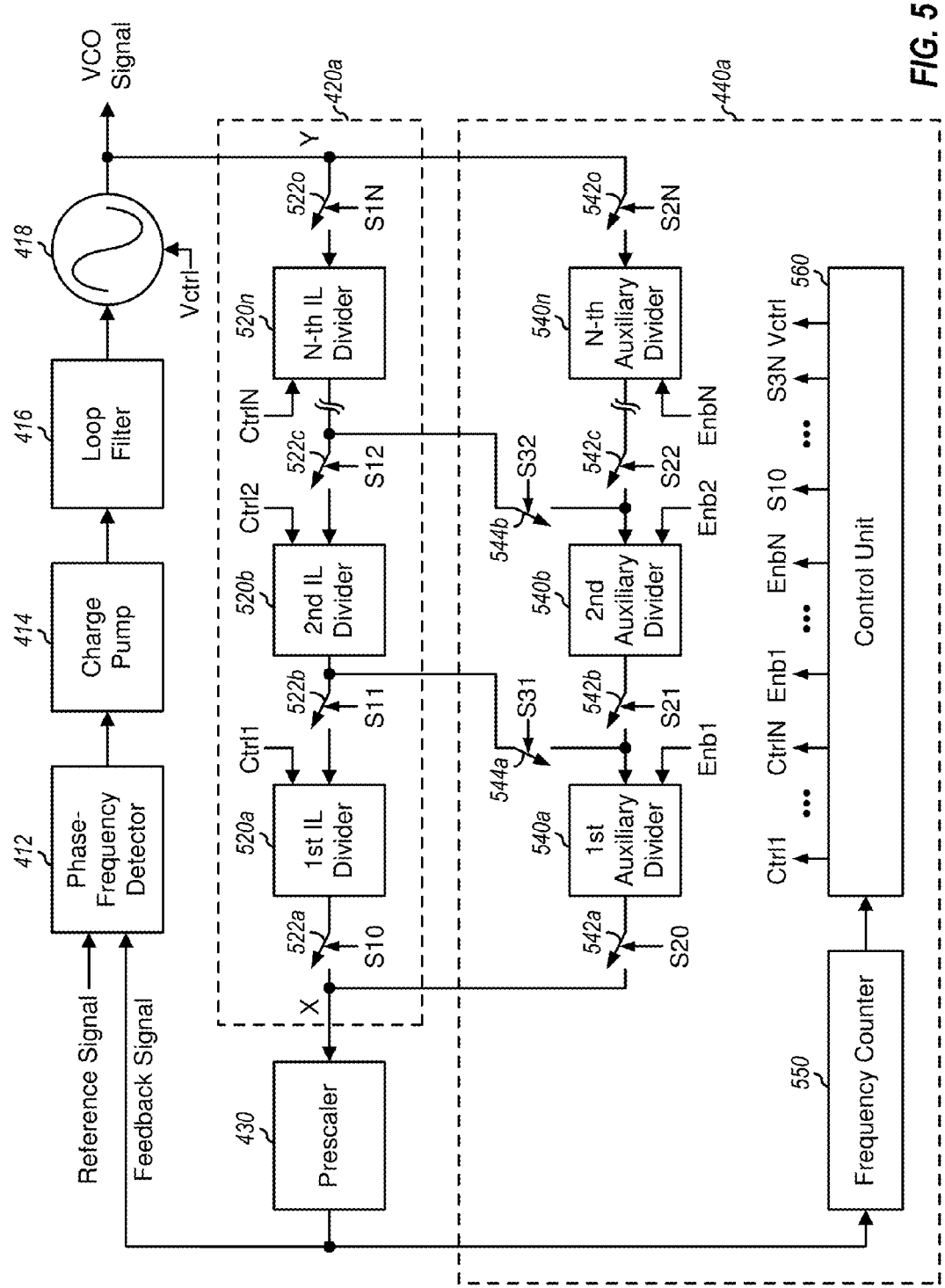
FIGS. 5 and 6 show block diagrams of two designs of an IL divider circuit and a calibration circuit.

FIG. 5 shows a block diagram of an IL divider circuit 420a and a calibration circuit 440a, which are one exemplary design of IL divider circuit 420 and calibration circuit 440 in FIG. 4. In the exemplary design shown in FIG. 5, IL divider circuit 420a includes N IL dividers 520a to 520n coupled in series and between node X and node Y, where N may be any integer value of one or greater. Each IL divider 520 may be designed to operate at a target frequency for that IL divider. Each IL divider 520 may also be designed with any suitable divider ratio (e.g., 2, 3, 4, 8, etc.), which may be selected based on a target oscillation frequency of VCO 418, an overall divider ratio for all IL dividers 520, etc. The N IL dividers 520a to 520n may have the same divider ratio (e.g., 4) or different divider ratios. Prescaler 430 has its input coupled to node X and its output providing the feedback signal to phase-frequency detector 412.

In the design shown in FIG. 5, calibration circuit 440a includes N auxiliary dividers 540a to 540n coupled in series and between node X and node Y. Auxiliary dividers 540 may be static dividers having fixed divider ratios. Auxiliary dividers 540 may also be dynamic dividers, e.g., Miller dividers. Auxiliary dividers 540 may be used to calibrate IL dividers 520 and/or VCO 418.

In the design shown in FIG. 5, calibration circuit 440a further includes a frequency counter 550 and a control unit 560. Frequency counter 550 receives the feedback signal from prescaler 430, estimates the frequency of the feedback signal, and provides the estimated frequency to control unit 560. Control unit 560 generates control signals for IL dividers 520a to 520n, auxiliary dividers 540a to 540n, VCO 418, and switches interconnecting IL dividers 520, auxiliary dividers 540, VCO 418, and prescaler 430.

FIG. 5 shows an exemplary design of interconnection between IL dividers 520a to 520n, auxiliary dividers 540a to 540n, VCO 418, and prescaler 430. In this design, a separate switch 522 is coupled between consecutive IL dividers 520, between the output of the first IL divider 520a and node X, and also between input of the last IL divider 520n and node Y. A separate switch 542 is coupled between consecutive auxiliary dividers 540, between the output of the first auxiliary divider 540a and node X, and also between input of the last auxiliary divider 540n and node Y. A separate switch 544 is coupled between the input of the i-th auxiliary divider 540 and the output of the (i+1)-th IL divider 520, for i=1, . . . , N−1. Switches 522, 542 and 544 may enable IL dividers 520a to 520n to be individually calibrated, as described below. Switches 522, 542 and 544 may be implemented with transistors and/or other circuit components.

IL dividers 520a to 520n, auxiliary dividers 540a to 540n, VCO 418, and prescaler 430 may also be connected in other manners. In another exemplary design, a separate switch may be coupled between consecutive IL dividers 520 and also between the input of the last IL divider 520n and node Y. A separate switch may be coupled between consecutive auxiliary dividers 540 (possible except between auxiliary dividers 540a and 540b) and also between the input of the last auxiliary divider 540n and node Y. A separate switch may be coupled between the output of the i-th IL divider 520 and the output of the i-th auxiliary divider 540, for i=2, . . . , N.

In general, IL divider circuit 420 may include any number of IL dividers. For clarity, an exemplary design in which IL divider circuit 420 includes two IL dividers is described below.

Figure 6:
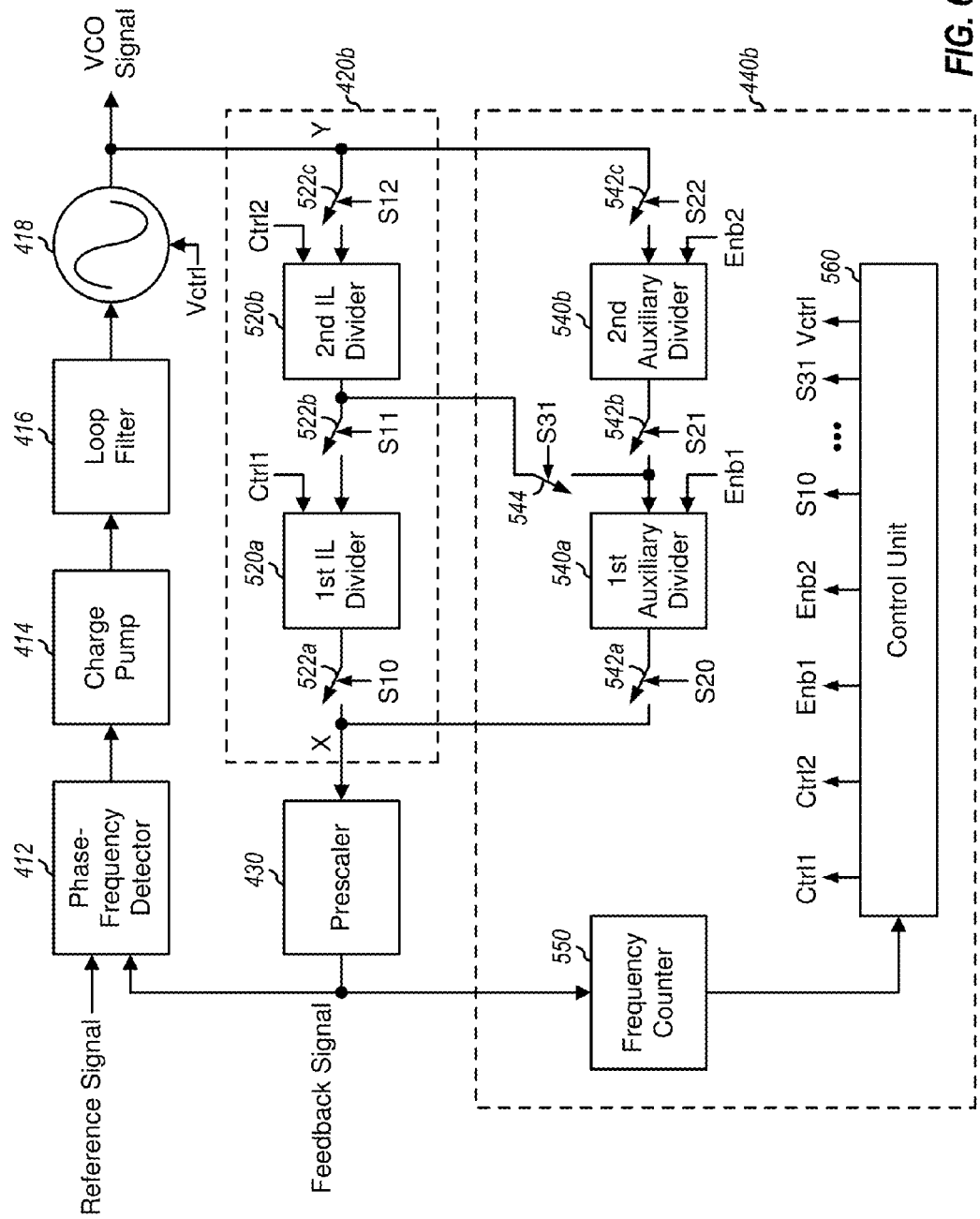

FIG. 6 shows a block diagram of an IL divider circuit 420b and a calibration circuit 440b, which are another exemplary design of IL divider circuit 420 and calibration circuit 440 in FIG. 4. In the exemplary design shown in FIG. 6, IL divider circuit 420b includes two IL dividers 520a and 520b coupled in series and between node X and node Y. Calibration circuit 440b includes two auxiliary dividers 540a and 540b coupled in series and between node X and node Y. Calibration circuit 440b further includes frequency counter 550 and control unit 560.

FIG. 6 shows an exemplary design of interconnection between IL dividers 520a and 520b, auxiliary dividers 540a and 540b, VCO 418, and prescaler 430. In this design, a switch 522a is coupled between the output of the first IL divider 520a and node X. A switch 522b is coupled between IL dividers 520a and 520b. A switch 522c is coupled between the input of the second IL divider 520b and node Y. A switch 542a is coupled between the output of the first auxiliary divider 540a and node X. A switch 542b is coupled between auxiliary dividers 540a and 540b. A switch 542c is coupled between the input of the second auxiliary divider 540b and node Y. A switch 544 is coupled between the output of the second IL divider 520b and the input of the first auxiliary divider 540a. IL dividers 520a and 520b, auxiliary dividers 540a and 540b, VCO 418, and prescaler 430 may also be connected in other manners.

Figure 7:
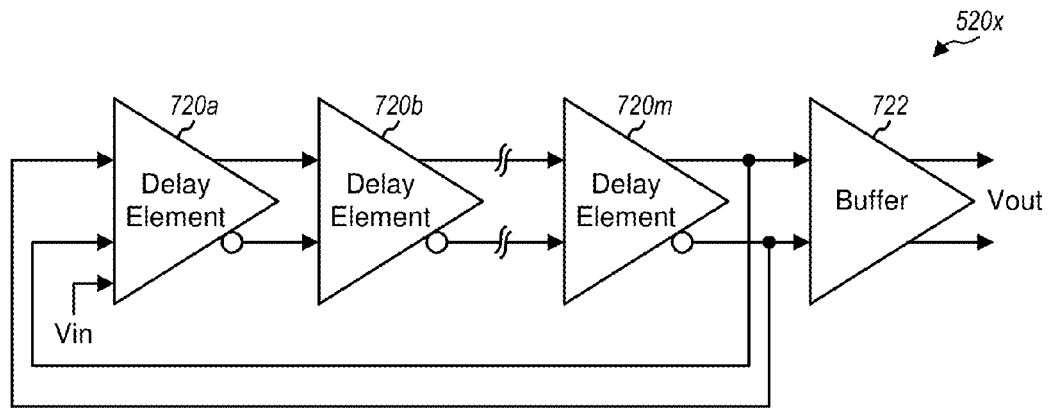
FIG. 7 shows a schematic diagram of a design of an IL divider.

FIG. 7 shows a schematic diagram of an exemplary design of an IL divider 520x, which may be used for each IL divider 520 in FIGS. 5 and 6. IL divider 520x includes multiple (M) delay elements 720a to 720m coupled in a loop and operating as a ring oscillator. Delay elements 720a to 720m may provide the same amount of delay or different amounts of delay. Each delay element 720 receives a differential input signal from a preceding delay element 720 and provides a differential output signal to a subsequent delay element 720. The last delay element 720m has its differential output signal swapped and provided to the input of the first delay element 720a.

The first delay element 720a receives an input signal, Vin, at an input frequency, $f_{in}$. A buffer 722 receives the differential output signal from the last delay element 720m and provides an output signal, Vout, at an output frequency, $f_{out}$. The output frequency may be related to the input frequency as follows:

$$f_{out} = \frac{f_{in}}{2k}, \qquad \text{Eq (1)}$$

where k may be any integer value. As shown in equation (1), IL divider 520x may be locked to the 2k-th harmonic of its self resonant frequency (SRF).

Figure 8A:
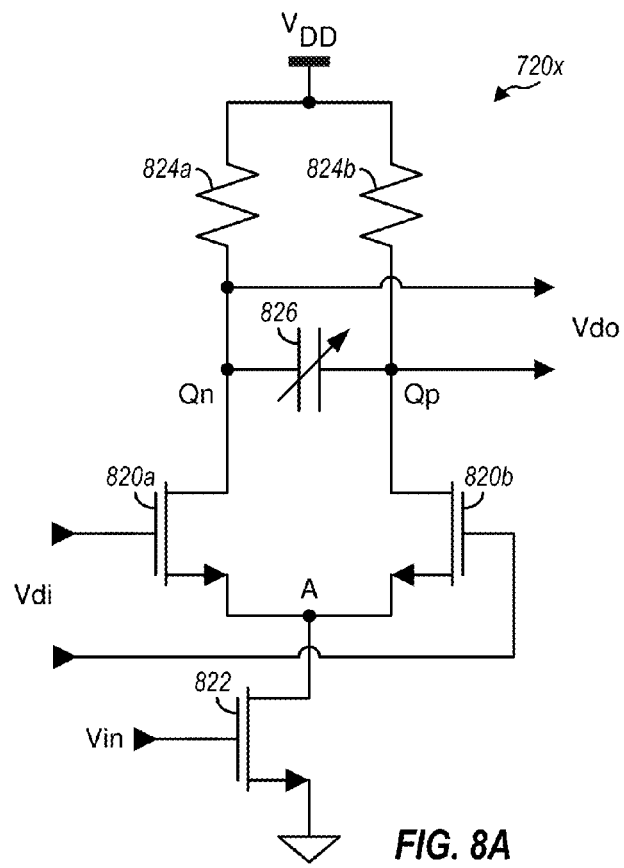
FIG. 8A shows a schematic diagram of a design of a tunable delay element

FIG. 8A shows a schematic diagram of an exemplary design of a tunable delay element 720x, which may be used for each of delay elements 720a to 720m in FIG. 7. Delay element 720x includes N-channel metal oxide semiconductor (NMOS) transistors 820a and 820b coupled as a differential pair. NMOS transistor 820a has its source coupled to node A and its drain coupled to node Qn. NMOS transistor 820b has its source coupled to node A and its drain coupled to node Qp.

An NMOS transistor 822 has its source coupled to circuit ground, its gate receiving the $V_{in}$ signal for the first delay element 720a of IL divider 520x, and it drain coupled to node A. A resistor 824a is coupled between a power supply voltage, $V_{DD}$, and node Qn. A resistor 824b is coupled between the $V_{DD}$ power supply voltage and node Qp.

Tunable delay element 720x further includes an adjustable capacitor 826 coupled between node Qn and node Qp. Adjustable capacitor 826 may include one or more variable capacitors (varactors). Each varactor has a capacitance that can be varied based on an analog control voltage. Alternatively or additionally, adjustable capacitor 826 may include a bank of switchable capacitors. Each switchable capacitor may be selected to increase the capacitance of capacitor 826 or not selected to reduce the capacitance of capacitor 826. Adjustable capacitor 826 may also include other types of capacitors, e.g., one or more fixed capacitors, with each fixed capacitor having a fixed capacitance value.

As shown in FIG. 8A, a differential input signal, Vdi, is provided to the gates of NMOS transistors 820a and 820b by a preceding delay element (not shown in FIG. 8A). A differential output signal, Vdo, is provided by the drains of NMOS transistors 820a and 820b to a subsequent delay element (not shown in FIG. 8A). Delay element 720x may be used for the first delay element 720a in FIG. 7, in which case the Vin signal may be provided to the gate of NMOS transistor 822, as shown in FIG. 8A. Delay element 720x may also be used for each of the remaining delay elements 720b to 720m in FIG. 7, in which case a bias voltage may be provided to the gate of NMOS transistor 822 (not shown in FIG. 8A).

The frequency of oscillation (i.e., the resonance frequency) of IL divider 520x in FIG. 7 may be expressed as:

$$f_{osc} \propto \frac{1}{2 \cdot M \cdot R_L \cdot C_L}, \quad \text{Eq (2)}$$

where $R_L$ is an equivalent resistance at the output of each delay element 720, $C_L$ is an equivalent capacitance at the output of each delay element 720, M is the number of delay elements 720 within IL divider 520x, and $f_{OSC}$ is the oscillation/resonance frequency of IL divider 520x.

As shown in equation (2), the oscillation frequency of IL divider 520x may be varied/tuned by changing the capacitance $C_L$ of each delay element 720. For example, each delay element 720 within IL divider 520x may include a bank of switchable capacitors. The oscillation frequency of IL divider 520x may be varied using the capacitor bank of each delay element 720. In particular, turning off a capacitor in the capacitor bank would decrease capacitance, which would then increase the oscillation frequency of IL divider 520x. Conversely, turning on a capacitor in the capacitor bank would increase capacitance, which would then decrease the oscillation frequency of IL divider 520x.

Figure 8B:
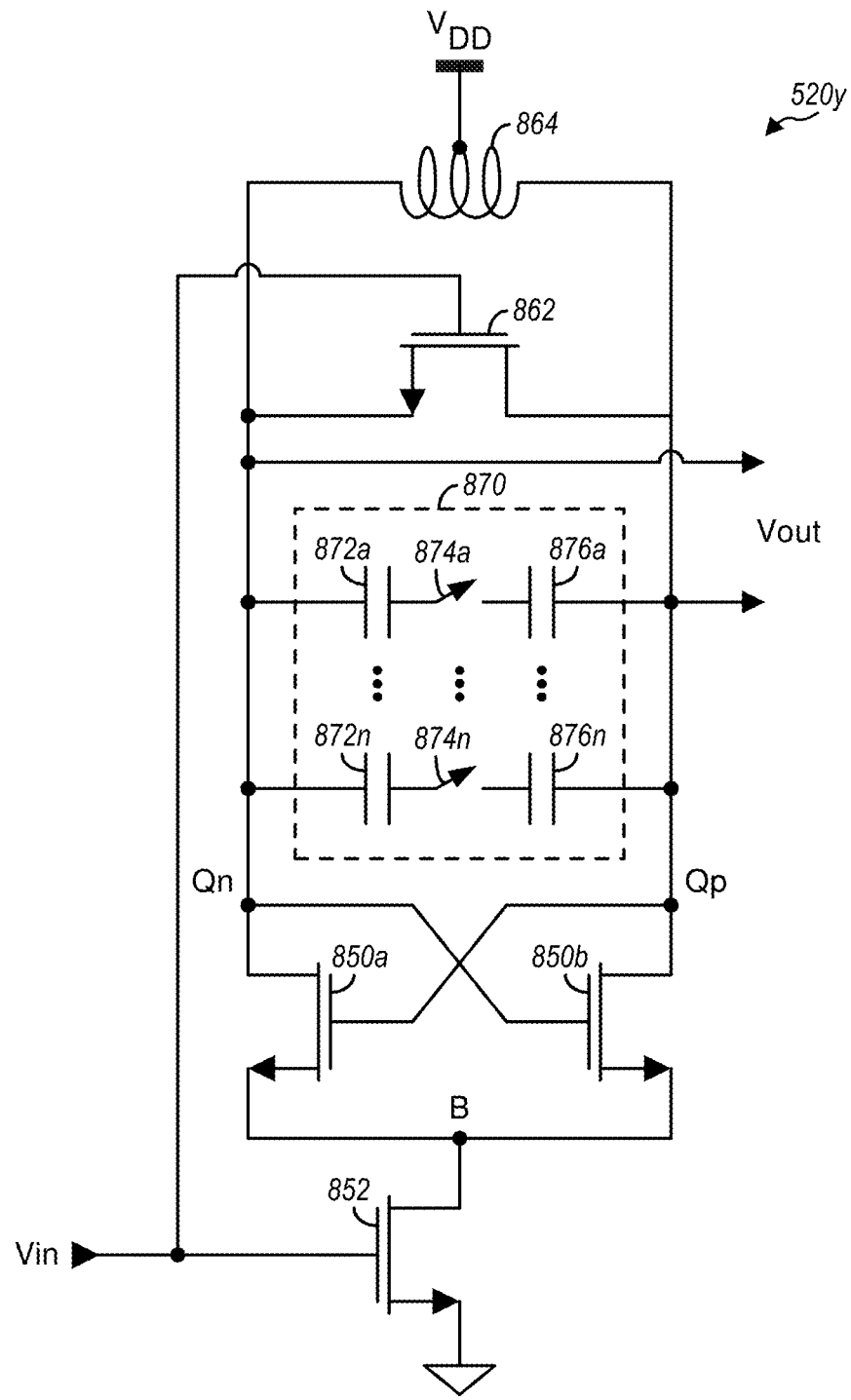
FIG. 8B shows a schematic diagram of another design of an IL divider.

FIG. 8B shows a schematic diagram of an exemplary design of an IL divider 520y, which may also be used for each IL divider 520 in FIGS. 5 and 6. IL divider 520y includes NMOS transistors 850a and 850b cross-coupled together and having their sources coupled to node B, their drains coupled to nodes Qn and Qp, respectively, and their gates coupled to nodes Qp and Qn, respectively. An NMOS transistor 852 has its source coupled to circuit ground and its drain coupled to node B. An NMOS transistor 862 has its source coupled to node Qn and its drain coupled to node Qp. An inductor 864 has a first end coupled to node Qn, a second end coupled to node Qp, and a center tap coupled to the $V_{DD}$ power supply. A capacitor bank 870 is coupled between nodes Qn and Qp and includes a number of branches. Each branch includes a series combination of a capacitor 872, a switch 874, and a capacitor 876, with the series combination being coupled between nodes Qn and Qp.

An input signal, Vin, is applied to the gates of NMOS transistors 852 and 862. An output signal, Vout, is provided by the drains of NMOS transistors 850a and 850b. The oscillation frequency of IL divider 520y may be varied/tuned by selecting one or more branches to change the capacitance of capacitor bank 870.

FIGS. 7 and 8B show an exemplary design of IL dividers 520x and 520y. An IL divider may also be implemented in other manners. In one design, an IL divider may be implemented with current-starved delay elements. A current-starved delay element may have a fixed capacitance but may provide a variable delay based on a bias current provided to the delay element. A shorter delay (and hence a higher oscillation frequency) may be obtained with more bias current, and vice versa. In another design, an IL divider may be implemented with an IL oscillator having a free-running oscillation frequency determined by one or more inductors and/or one or more capacitors within the IL oscillator. In general, the oscillation frequency of an IL divider may be varied by adjusting one or more characteristics such as capacitance, inductance, bias current, bias voltage, etc.

Referring back to FIG. 5, PLL 400 may operate in a calibration mode or an operational mode at any given moment. The calibration mode may be used to calibrate IL dividers 520 and/or VCO 418. Calibration may refer to adjustment of an oscillation frequency of a circuit (e.g., an IL divider or a VCO) to obtain a target oscillation frequency of the circuit. In one design, calibration may be performed prior to normal operation of wireless device 110 to ensure IL dividers 520 and/or VCO 418 operate at their target frequencies. For example, calibration may be performed when wireless device 110 is powered on, or after predetermined time intervals, or in response to certain trigger events (e.g., when temperature of wireless device 110 exceeds a certain threshold), or when frequency lock error is detected, or based on some other trigger events. In another design, calibration may be performed during manufacturing (e.g., during a testing phase) of wireless device 110. In yet another design, calibration may be performed after manufacturing of wireless device 110 (e.g., when wireless device 110 is activated for service).

In one design, calibration circuit 440 may be part of wireless device 110 and may be used to calibrate IL dividers 520 and/or VCO 418. For example, calibration circuit 440 may be part of data processor/controller 210 in FIG. 2 or may be part of a digital circuit within transceiver 220. In this design, auxiliary dividers 540, frequency counter 550, and control unit 560 may be enabled during calibration and may be disabled during normal operation of PLL 400. In another design, calibration circuit 440 may be external to wireless device 110, e.g., may be part of a test equipment used to text wireless device 110.

Calibration circuit 440 may calibrate IL dividers 520 and/or VCO 418 to ensure each IL divider 520 can injection lock to an input signal at a target frequency for that IL divider, which may be derived from the VCO signal from VCO 418. Each IL divider 520 may operate at a particular free-running oscillation frequency with an initial setting (e.g., a nominal capacitance for each delay element) prior to calibration. The free-running frequency may also be referred to as a natural frequency, an unperturbed frequency, a self-resonance frequency, etc. For clarity, calibration of IL dividers 520a and 520b in FIG. 6 is described below.

Figure 9C:
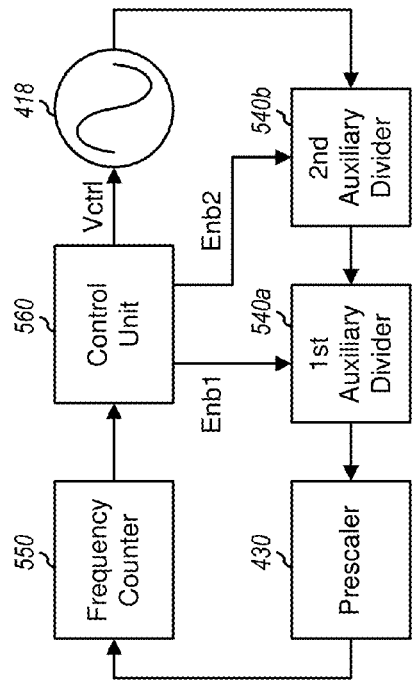
FIG. 9C shows calibration of a voltage-controlled oscillator (VCO).
Figure 9A:
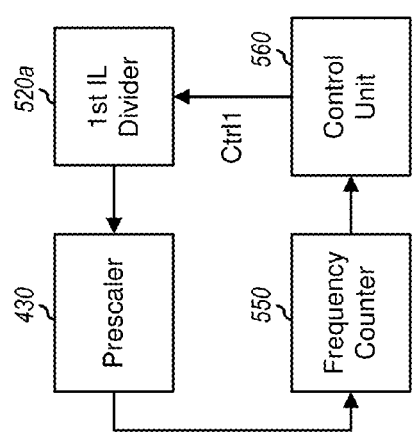
FIG. 9A shows calibration of a first IL divider in the novel PLL.

FIG. 9A shows calibration of the first IL divider 520a within IL divider circuit 420b in FIG. 6. In this calibration mode, IL divider 520a is free running by opening switch 522b in FIG. 6. IL divider 520a provides its output signal to prescaler 430 by closing switch 522a and opening switch 542a in FIG. 6. The remaining switches in FIG. 6 may be opened. Prescaler 430 provides the feedback signal to frequency counter 550.

Control unit 560 may initially set the first IL divider 520a to an initial setting via a Ctrl control. The initial setting may be associated with a nominal capacitance for each delay element within IL divider 520a. IL divider 520a is free running with the initial setting and provides its output signal at an initial frequency to prescaler 430. Prescaler 430 divides the output signal in frequency by a factor of K and provides the feedback signal at a lower frequency to frequency counter 550. The frequency of the output signal from IL divider 520a may be denoted as $f_{ILD1}$. The frequency of the feedback signal from prescaler 430 may be denoted as $f_{PS}$ and may be referred to as the prescaler output frequency. When only IL divider 520a is enabled as shown in FIG. 9A, the prescaler output frequency may be given as $f_{PS}=f_{ILD1}/K$.

Frequency counter 550 receives the feedback signal, counts the number of cycles of the feedback signal within a measurement window of $T_{WIN}$ seconds, and provides a count value to control unit 560. Control unit 560 estimates the frequency of the first IL divider 520a based on the count value from frequency counter 550, the duration of the measurement window, and the divider ratio of prescaler 430, as follows:

$$\hat{f}_{ILD1} = \frac{K \cdot C_{ILD1}}{T_{WIN}}, \quad \text{Eq (3)}$$

where $C_{ILD1}$ is the count value for the first IL divider 520a, and $\hat{f}_{ILD1}$ is an estimated oscillation frequency of the first IL divider 520a.

As shown in equation (3), the oscillation frequency of the first IL divider 520a is proportional to the count value and is inversely proportional to the measurement window duration. A more accurate estimate of the oscillation frequency may be obtained with a longer measurement window. The measurement window may be selected to provide a suitably accurate estimate of the oscillation frequency, e.g., a frequency estimate with 1% accuracy or some other level of accuracy.

Control unit 560 may estimate the initial oscillation frequency of the first IL divider 520a with the initial setting. Control unit 560 may also determine a target frequency of IL divider 520a, which may be dependent on a desired VCO frequency and a divider ratio of each divider in the feedback path from VCO 418 to phase-frequency detector 412. For example, the desired VCO frequency may be 60 GHz, and IL dividers 520a and 520b may each have a divider ratio of 4. In this case, IL divider 520a may be designed to receive an input signal at a frequency of 15 GHz and may have a target frequency of 3.75 GHz. Control unit 560 may determine the error between the estimated oscillation frequency and the target frequency of IL divider 520a. Control unit 560 may vary the capacitance and/or other characteristics (e.g., bias current) of IL divider 520a to adjust/tune the oscillation frequency of IL divider 520a toward the target frequency.

Control unit 560 may perform calibration of the first IL divider 520a in an iterative manner until the oscillation frequency of IL divider 520b is within a predetermined tolerance (e.g., 1%) of the target frequency. In particular, control unit 560 may vary the setting of IL divider 520a based on the error between the estimated oscillation frequency and the target frequency. Control unit 560 may then re-estimate the oscillation frequency of IL divider 520a with the new setting. Control unit 560 may next determine the error between the estimated oscillation frequency with the new setting and the target frequency. Control unit 560 may repeat the process and again vary the setting of IL divider 520a if the error is not within the predetermined tolerance. The predetermined tolerance may be selected based on an expected locking range of IL divider 520a, e.g., a smaller tolerance for a smaller locking range, and vice versa.

Figure 9D:
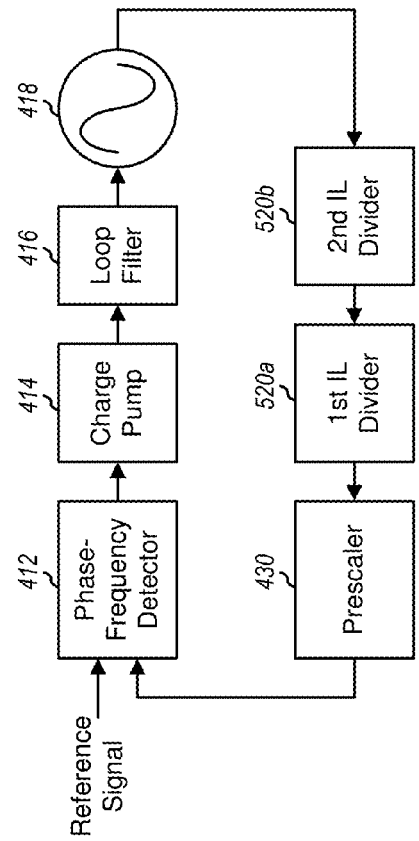
FIG. 9D shows normal operation of the novel PLL with tunable IL dividers.
Figure 9B:
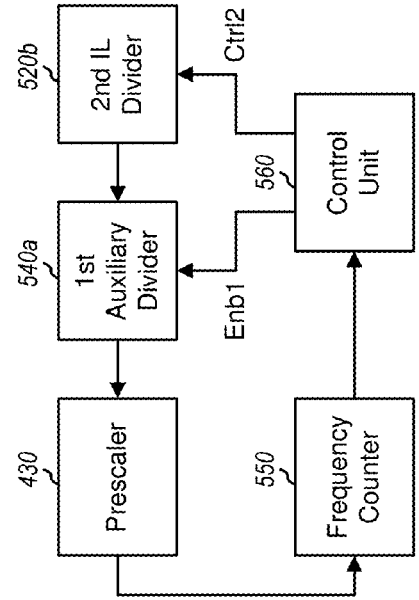
FIG. 9B shows calibration of a second IL divider in the novel PLL.

FIG. 9B shows calibration of the second IL divider 520b within IL divider circuit 420b in FIG. 6. In this calibration mode, IL divider 520b is free running by opening switch 522c in FIG. 6. IL divider 520b provides its output signal to first auxiliary divider 540a by closing switch 544 and opening switch 542b in FIG. 6. Auxiliary divider 540a provides its output signal to prescaler 430 by closing switch 542a and opening switch 522a in FIG. 6. The remaining switches in FIG. 6 may be opened. Prescaler 430 provides the feedback signal to frequency counter 550. First auxiliary divider 540a may have the same divider ratio as the first IL divider 520a and may be used in place of the first IL divider 520a when calibrating the second IL divider 520b.

Control unit 560 may initially set the second IL divider 520b to an initial setting via a Ctrl2 control. The initial setting may be associated with a nominal capacitance for each delay element within IL divider 520b. IL divider 520b is free running with the initial setting and provides its output signal at an initial oscillation frequency to auxiliary divider 540a, which further provides it output signal to prescaler 430. Prescaler 430 divides the output signal from auxiliary divider 540a in frequency by a factor of K and provides the feedback signal to frequency counter 550. The frequency of the output signal from IL divider 520b may be denoted as $f_{ILD2}$, and the frequency of the feedback signal from prescaler 430 may be denoted as $f_{PS}$. When IL divider 520b and auxiliary divider 540a are enabled as shown in FIG. 9B, the prescaler output frequency may be given as $$f_{PS} = \frac{f_{ILD2}}{K \cdot L_1},$$

where $L_1$ is the divider ratio of the first auxiliary divider 540a and also the divider ratio of the first IL divider 520a.

Frequency counter 550 receives the feedback signal, counts the number of cycles of the feedback signal within a measurement window of $T_{WIN}$ seconds, and provides a count value to control unit 560. Control unit 560 estimates the oscillation frequency of the second IL divider 520b based on the count value from frequency counter 550, the measurement window duration, and the divider ratios of the first auxiliary divider 540a and prescaler 430, as follows:

$$\hat{f}_{ILD2} = \frac{K \cdot L_1 \cdot C_{ILD2}}{T_{WIN}}, \quad \text{Eq (4)}$$

where $C_{ILD2}$ is the count value for the second IL divider 520b, and $\hat{f}_{ILD2}$ is an estimated oscillation frequency of the second IL divider 520b.

Control unit 560 may estimate the initial oscillation frequency of the second IL divider 520b with the initial setting. Control unit 560 may also determine a target frequency of IL divider 520b, which may be dependent on the desired VCO frequency and the divider ratio of each divider in the feedback path from VCO 418 to phase-frequency detector 412. For example, the desired VCO frequency may be 60 GHz, and IL dividers 520a and 520b may each have a divider ratio of 4. In this case, IL divider 520b may be designed to receive an input signal at a frequency of 60 GHz and may have a target frequency of 15 GHz. Control unit 560 may determine the error between the estimated oscillation frequency and the target frequency of IL divider 520b. Control unit 560 may vary the capacitance and/or other characteristics (e.g., bias current) of IL divider 520b to adjust the oscillation frequency of IL divider 520b toward the target frequency. Control unit 560 may perform calibration of the second IL divider 520b in an iterative manner until the oscillation frequency of IL divider 520b is within a predetermined tolerance (e.g., 1%) of the target frequency.

FIG. 9C shows calibration of VCO 418 in FIG. 6. In this calibration mode, auxiliary dividers 540a and 540b are selected and enabled, and IL dividers 520a and 520b are not selected and disabled. VCO 418 provides the VCO signal to auxiliary divider 540b via closed switch 542c. Auxiliary divider 540b provides its output signal to auxiliary divider 540a via closed switch 542b. Auxiliary divider 540a provides its output signal to prescaler 430 via closed switch 542a. The remaining switches in FIG. 6 may be opened. Prescaler 430 provides the feedback signal to frequency counter 550. First auxiliary divider 540a may have the same divider ratio as the first IL divider 520a and may be used in place of the first IL divider 520a when calibrating VCO 418. Second auxiliary divider 540b may have the same divider ratio as the second IL divider 520b and may be used in place of the second IL divider 520b when calibrating VCO 418.

Control unit 560 may initially set VCO 418 to an initial setting via a Vctrl control. The initial setting may be associated with a nominal capacitance for VCO 418. VCO 418 then operates with the initial setting and provides the VCO signal at an initial VCO frequency. The VCO signal is divided in frequency by auxiliary dividers 540a and 540b and then by prescaler 430 to obtain the feedback signal. The frequency of the VCO signal may be denoted as $f_{VCO}$, and the frequency of the feedback signal from prescaler 430 may be denoted as $f_{PS}$. When auxiliary dividers 540a and 540b are enabled as shown in FIG. 9C, the prescaler output frequency may be given as $$f_{PS} = \frac{f_{VCO}}{K \cdot L_1 \cdot L_2},$$

where $L_1$ is the divider ratio of the first auxiliary divider 540a and $L_2$ is the divider ratio of the second auxiliary divider 540b.

Frequency counter 550 receives the feedback signal, counts the number of cycles of the feedback signal within a measurement window of $T_{WIN}$ seconds, and provides a count value to control unit 560. Control unit 560 estimates the oscillation frequency of VCO 418 based on the count value from frequency counter 550, the measurement window duration, and the divider ratios of auxiliary dividers 540a and 540b and prescaler 430, as follows:

$$\hat{f}_{VCO} = \frac{K \cdot L_1 \cdot L_2 \cdot C_{VCO}}{T_{WIN}}, \qquad \text{Eq (5)}$$

where $C_{VCO}$ is the count value for VCO 418, and
$\hat{f}_{VCO}$ is an estimated oscillation frequency of VCO 418.

Control unit 560 may estimate the initial oscillation frequency of VCO 418 with the initial setting. Control unit 560 may determine the error between the estimated oscillation frequency and the target oscillation frequency of VCO 418. Control unit 560 may vary one or more characteristics (e.g., capacitance, inductance, bias current, etc.) of VCO 418 to adjust the oscillation frequency of VCO 418 toward the target oscillation frequency. Control unit 560 may perform calibration of VCO 418 in an iterative manner until the oscillation frequency of VCO 418 is within a predetermined tolerance (e.g., 1%) of the target oscillation frequency.

FIG. 9D shows normal operation of PLL 400. In the normal operational mode, IL dividers 520a and 520b are selected and enabled and may provide good phase noise performance and low power consumption. Auxiliary dividers 540a and 540b are not selected and disabled and hence would not consume power or adversely affect phase noise performance. VCO 418 provides the VCO signal to IL divider 520b via closed switch 522c. IL divider 520b provides its output signal to IL divider 520a via closed switch 522b. IL divider 520a provides its output signal to prescaler 430 via closed switch 522a. The remaining switches in FIG. 6 may be opened. Prescaler 430 provides the feedback signal to phase-frequency detector 412.

Figures 10, 11:
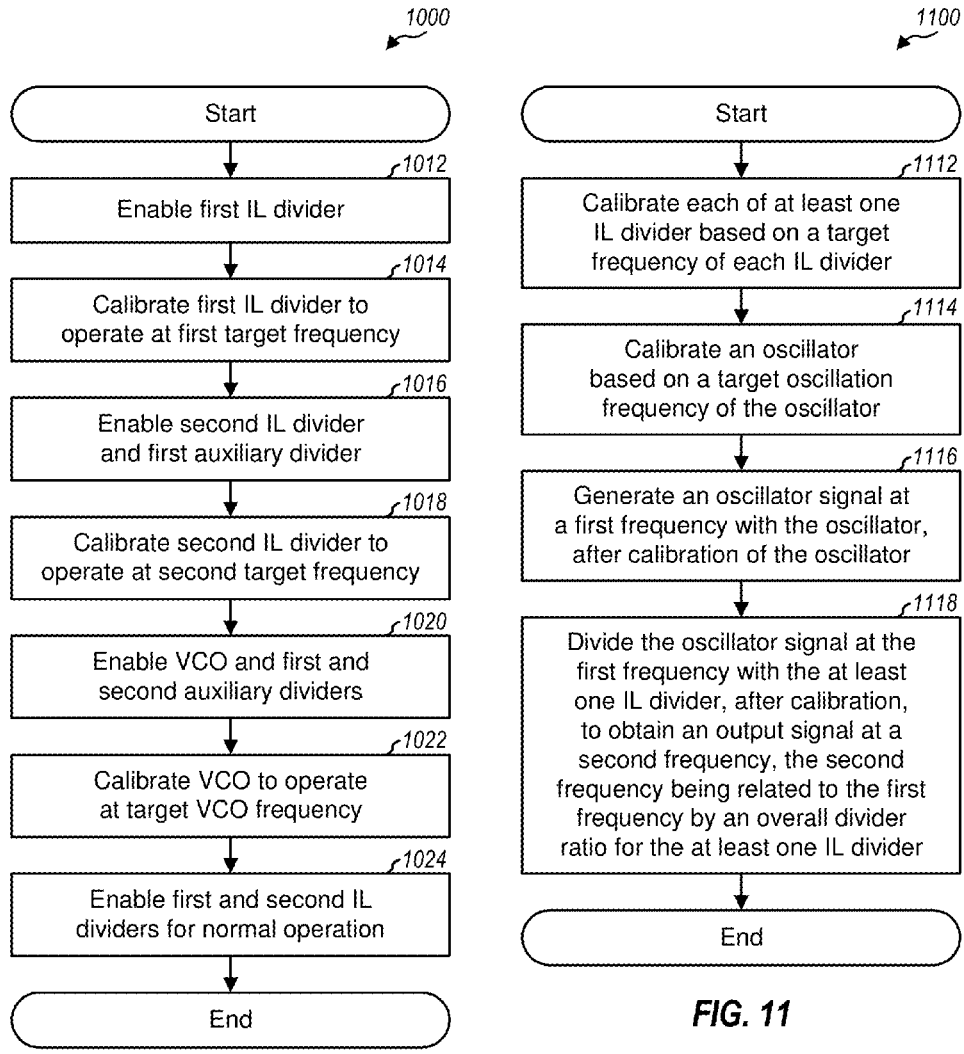
FIG. 10 shows a process for calibrating two IL dividers.
FIG. 11 shows a process for performing frequency synthesis.

FIG. 10 shows a design of a process 1000 for calibrating two IL dividers 520a and 520b within PLL 400 in FIG. 6. The first IL divider 520a may be enabled (block 1012) and may be calibrated to operate at a first target frequency (block 1014). For block 1014, the oscillation frequency of IL divider 520a may be estimated and compared against the first target frequency. The capacitance of IL divider 520a may be adjusted to move the oscillation frequency of IL divider 520a toward the first target frequency.

The second IL divider 520b and the first auxiliary divider 540a may be enabled (block 1016). IL divider 520b may be calibrated to operate at a second target frequency (block 1018). For block 1018, the oscillation frequency of IL divider 520b may be estimated and compared against the second target frequency. The capacitance of IL divider 520b may be adjusted to move the oscillation frequency of IL divider 520b toward the second target frequency.

VCO 418 and auxiliary dividers 540a and 540b may be enabled (block 1020). VCO 418 may be calibrated to operate at a target VCO frequency (block 1022). For block 1022, the oscillation frequency of VCO 418 may be estimated and compared against the target VCO frequency. The capacitance and/or other characteristics of VCO 418 may be adjusted to move the oscillation frequency of VCO 418 toward the target VCO frequency. After calibrating IL dividers 520a and 520b and VCO 418, IL dividers 520a and 520b may be enabled for normal operation (block 1024).

In general, a PLL may include any number of IL dividers. Each IL divider may be individually calibrated to ensure that IL divider can injection lock to an input signal at a target frequency for that IL divider. Each IL divider may be individually calibrated by enabling only that IL divider and disabling all remaining IL dividers, e.g., as shown in FIGS. 9A and 9B. For a given IL divider X being calibrated, each IL divider located after IL divider X may be disabled and substituted with an auxiliary divider having the same divider ratio as the disabled IL divider. This would enable IL divider X and other circuits (e.g., prescaler 430) located after IL divider X to operate at their designed frequencies. The IL dividers may be calibrated in any order. Auxiliary dividers may be used to aid calibration of IL dividers and/or the VCO, e.g., as shown in FIGS. 9B and 9C. Alternatively, auxiliary dividers may be omitted, and calibrated IL dividers may be used to calibrate other IL dividers and/or the VCO. For example, after calibrating the first IL divider 520a, the calibrated first IL divider 520a may be used to calibrate the second IL divider 520b.

The tunable IL dividers described herein may provide various advantages. First, the tunable IL dividers have enhanced locking range and may be suitable for use in PLLs, especially PLLs operating at very high frequencies. Second, the tunable IL dividers may have better phase noise performance and lower power consumption than static dividers. Third, the tunable IL dividers may be designed as resonant-based circuits that do not need a large voltage headroom and may thus be able to operate at low power supply voltages. The tunable IL dividers can thus take advantage of CMOS IC processes scaling toward smaller geometries and power supply moving toward lower voltages. The tunable IL dividers may enable PLLs and LO circuits to operate with lower power supply voltages.

In an exemplary design, an apparatus (e.g., a wireless device, an IC, a circuit module, etc.) may include an oscillator and at least one IL divider. The oscillator (e.g., VCO 418 in FIGS. 5 and 6) may provide an oscillator signal at a first frequency. The at least one IL divider (e.g., IL dividers 520 in FIGS. 5 and 6) may receive the oscillator signal at the first frequency and provide an output signal at a second frequency. The second frequency may be related to the first frequency by an overall divider ratio for the at least one IL divider. Each of the at least one IL divider may be calibrated based on a target frequency of each IL divider. For example, each IL divider may be calibrated to obtain an oscillation frequency within a predetermined tolerance of the target frequency of that IL divider. The oscillator may also be calibrated based on a target oscillation frequency of the oscillator. Calibration may be performed at power on of the wireless device, at predetermined time intervals, and/or in response to a trigger event.

The apparatus may further include a calibration circuit (e.g., calibration circuit 440 in FIG. 4) that may calibrate each of the at least one IL divider. In one exemplary design, the calibration circuit may include at least one auxiliary divider, a frequency counter, and a control unit, e.g., as shown in FIGS. 5 and 6. The at least one auxiliary divider may correspond to the at least one IL divider. Each auxiliary divider may be associated with one IL divider and may have the same divider ratio as that of the associated IL divider. Each auxiliary divider may be selectable to substitute for the associated IL divider. Each auxiliary divider may be selected when an IL divider preceding the associated IL divider is being calibrated. The at least one auxiliary divider may be disabled during normal operation. The frequency counter may perform frequency counting to estimate an oscillation frequency of an IL divider being calibrated. The control unit may select one IL divider at a time for calibration and may adjust/tune the selected IL divider toward a target frequency of the selected IL divider. The control unit may adjust at least one characteristic (e.g., the capacitance) of the selected IL divider to tune an oscillation frequency of the selected IL divider within a predetermined tolerance of the target frequency of the selected IL divider In one design, the at least one IL divider may include a first IL divider, e.g., IL divider 520*a* in FIG. 6. Only the first IL divider may be selected and remaining ones of the at least one IL divider (if any) may not be selected when the first IL divider is being calibrated, e.g., as shown in FIG. 9A. In one design, the calibration circuit may include a first auxiliary divider associated with the first IL divider, and the at least one IL divider may include a second IL divider. The first auxiliary divider and the second IL divider may be selected when the second IL divider is being calibrated (e.g., as shown in FIG. 9B). In one design, the calibration circuit may further include a second auxiliary divider associated with the second IL divider. The first and second auxiliary dividers may be selected when the oscillator is being calibrated, e.g., as shown in FIG. 9C. The first and second IL dividers may be selected during operation of the apparatus after calibration of the first and second IL dividers, e.g., as shown in FIG. 9D. The first IL divider and the first auxiliary divider may have the same divider ratio. The second IL divider and the second auxiliary divider may have the same divider ratio. The first and second IL dividers may have the same divider ratio or different divider ratios.

In one design, each IL divider may comprise a plurality of delay elements coupled in a loop, e.g., as shown in FIG. 7. One delay element (e.g., delay element 720*a* in FIG. 7) may receive an input signal for the IL divider. The plurality of delay elements for each IL divider may include at least one adjustable capacitor (e.g., capacitor 826 in FIG. 8A) that can be varied to tune an oscillation frequency of the IL divider. In another design, each IL divider may comprise an oscillator circuit, e.g., as shown in FIG. 8B.

FIG. 11 shows an exemplary design of a process 1100 for performing frequency synthesis. Each of at least one IL divider may be calibrated based on a target frequency of each IL divider (block 1112). For example, each IL divider may be calibrated to have an oscillation frequency within a predetermined tolerance of a target frequency of that IL divider. An oscillator may be calibrated based on a target oscillation frequency of the oscillator (block 1114). An oscillator signal at a first frequency may be generated with the oscillator, after calibration of the oscillator (block 1116). The oscillator signal may be divided in frequency with the at least one IL divider, after calibration, to obtain an output signal at a second frequency (block 1118). The second frequency may be related to the first frequency by an overall divider ratio for the at least one IL divider.

In one design of block 1112, one IL divider may be selected at a time for calibration from among the at least one IL divider. The selected IL divider may be calibrated based on a target frequency of the selected IL divider. In one design, an oscillation frequency of the selected IL divider may be estimated, e.g., with a frequency counter. An error between the estimated oscillation frequency and the target frequency of the selected IL divider may be determined. At least one characteristic (e.g., the capacitance) of the selected IL divider may be adjusted to tune the oscillation frequency of the selected IL divider toward the target frequency. The estimating the oscillation frequency, the determining the error, and the adjusting at least one characteristic of the selected IL divider may be repeated at least one additional time to tune the oscillation frequency of the selected IL divider to within a predetermined tolerance of the target frequency.

In one design, the at least one IL divider may include a first IL divider. For block 1112, only the first IL divider may be selected and remaining ones of the at least one IL divider may not be selected when the first IL divider is being calibrated, e.g., as shown in FIG. 9A. The first IL divider may be calibrated based on a first target frequency of the first IL divider. The at least one IL divider may further include a second IL divider. For block 1112, the second IL divider and a first auxiliary divider associated with the first IL divider may be selected when the second IL divider is being calibrated, e.g., as shown in FIG. 9B. The second IL divider may be calibrated based on a second target frequency of the second IL divider. In one design of block 1114, the first auxiliary divider and a second auxiliary divider associated with the second IL divider may be selected when the oscillator is being calibrated, e.g., as shown in FIG. 9C. The oscillator may be calibrated based on a target oscillation frequency of the oscillator. The first and second IL dividers may be selected during operation of a wireless device, e.g., as shown in FIG. 9D.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
   an oscillator configured to provide an oscillator signal at a first frequency;
   at least one injection locked (IL) divider configured to receive the oscillator signal at the first frequency and to provide an output signal at a second frequency, the second frequency being related to the first frequency by an overall divider ratio for the at least one IL divider, each of the at least one IL divider being calibrated based on a target frequency of each IL divider; and
   a calibration circuit configured to calibrate each of the at least one IL divider, the calibration circuit comprising:
   at least one auxiliary divider corresponding to the at least one IL divider, each auxiliary divider being selectable to substitute for an associated IL divider.

2. The apparatus of claim 1, the calibration circuit comprising:
   a frequency counter configured to perform frequency counting to estimate an oscillation frequency of an IL divider being calibrated among the at least one IL divider.

3. The apparatus of claim 1, the calibration circuit comprising:
   a control unit configured to select one IL divider at a time for calibration among the at least one IL divider and to tune the selected IL divider toward a target frequency of the selected IL divider.

4. The apparatus of claim 3, wherein the oscillator is calibrated based on a target oscillation frequency of the oscillator.

5. The apparatus of claim 1,
   wherein the at least one IL divider comprises a first IL divider, and wherein only the first IL divider is selected and remaining ones of the at least one IL divider, if any, are not selected when the first IL divider is being calibrated.

6. The apparatus of claim 5, wherein the calibration circuit comprises a first auxiliary divider associated with the first IL divider, wherein the at least one IL divider further comprises a second IL divider, and wherein the first auxiliary divider and the second IL divider are selected when the second IL divider is being calibrated.

7. The apparatus of claim 6, wherein the calibration circuit further comprises a second auxiliary divider associated with the second IL divider, and wherein the first and second auxiliary dividers are selected when the oscillator is being calibrated.

8. The apparatus of claim 6, wherein the first and second IL dividers are selected during operation of the apparatus after calibration of the first and second IL dividers.

9. The apparatus of claim 1,
wherein each IL divider among the at least one IL divider comprises a plurality of delay elements coupled in a loop.

10. The apparatus of claim 9, wherein the plurality of delay elements for each IL divider comprise at least one adjustable capacitor that can be varied to tune an oscillation frequency of the IL divider.

11. The apparatus of claim 3, wherein each IL divider among the at least one IL divider comprises an oscillator circuit.

12. A method of performing frequency synthesis, comprising:
calibrating each of at least one injection locked (IL) divider based on a target frequency of each IL divider, wherein the calibrating each of the at least one IL divider comprises:
selecting one IL divider at a time for calibration from among the at least one IL divider, and
calibrating the selected IL divider based on a target frequency of the selected IL divider;
dividing an oscillator signal at a first frequency with the at least one IL divider, after calibration, to obtain an output signal at a second frequency, the second frequency being related to the first frequency by an overall divider ratio for the at least one IL divider; and
selectively substituting at least one auxiliary divider corresponding to the at least one IL divider for said IL divider.

13. The method of claim 12, further comprising:
calibrating an oscillator based on a target oscillation frequency of the oscillator; and
generating the oscillator signal at the first frequency with the oscillator, after calibration of the oscillator.

14. The method of claim 12, wherein the calibrating the selected IL divider comprises
estimating an oscillation frequency of the selected IL divider,
determining an error between the estimated oscillation frequency and the target frequency of the selected IL divider, and
adjusting at least one characteristic of the selected IL divider to tune the oscillation frequency of the selected IL divider toward the target frequency.

15. The method of claim 14, wherein the calibrating the selected IL divider further comprises
repeating the estimating the oscillation frequency, the determining the error, and the adjusting at least one characteristic of the selected IL divider at least one additional time to tune the oscillation frequency of the selected IL divider to within a predetermined tolerance of the target frequency.

16. The method of claim 12,
wherein the at least one IL divider comprises a first IL divider, and wherein the calibrating each of the at least one IL divider comprises:
selecting only the first IL divider and not selecting remaining ones of the at least one IL divider, if any, when the first IL divider is being calibrated, and
calibrating the first IL divider based on a first target frequency of the first IL divider.

17. The method of claim 16, wherein the at least one IL divider further comprises a second IL divider, and wherein the calibrating each of the at least one IL divider comprises:
selecting the second IL divider and a first auxiliary divider associated with the first IL divider when the second IL divider is being calibrated, and
calibrating the second IL divider based on a second target frequency of the second IL divider.

18. The method of claim 17, further comprising:
selecting the first auxiliary divider and a second auxiliary divider associated with the second IL divider when an oscillator is being calibrated; and
calibrating the oscillator based on a target oscillation frequency of the oscillator.

19. The method of claim 17, further comprising:
selecting the first and second IL dividers during operation of a wireless device.

20. An apparatus comprising:
means for calibrating each of at least one injection locked (IL) divider based on a target frequency of each IL divider, wherein the means for calibrating each of the at least one IL divider comprises:
means for selecting one IL divider at a time for calibration from among the at least one IL divider, and
means for calibrating the selected IL divider based on a target frequency of the selected IL divider;
means for directing the at least one IL divider, after calibration, to divide an oscillator signal at a first frequency to obtain an output signal at a second frequency, the second frequency being related to the first frequency by an overall divider ratio for the at least one IL divider; and
means for selectively substituting at least one auxiliary divider corresponding to the at least one IL divider for said IL divider.

21. The apparatus of claim 20, further comprising:
means for calibrating an oscillator based on a target oscillation frequency of the oscillator; and
means for directing the oscillator, after calibration, to generate the oscillator signal at the first frequency.

22. The apparatus of claim 20, wherein the means for calibrating the selected IL divider comprises
means for estimating an oscillation frequency of the selected IL divider,
means for determining an error between the estimated oscillation frequency and the target frequency of the selected IL divider, and
means for adjusting at least one characteristic of the selected IL divider to tune the oscillation frequency of the selected IL divider toward the target frequency.

23. The apparatus of claim 22, wherein the means for calibrating the selected IL divider further comprises
means for repeating estimating the oscillation frequency, determining the error, and adjusting at least one characteristic of the selected IL divider at least one additional time to tune the oscillation frequency of the selected IL divider to within a predetermined tolerance of the target frequency.

24. The apparatus of claim 20,
wherein the at least one IL divider comprises a first IL divider, and wherein the means for calibrating each of the at least one IL divider comprises:
means for selecting only the first IL divider and not selecting remaining ones of the at least one IL divider, if any, when the first IL divider is being calibrated, and
means for calibrating the first IL divider based on a first target frequency of the first IL divider.

25. The apparatus of claim 24, wherein the at least one IL divider further comprises a second IL divider, and wherein the means for calibrating each of the at least one IL divider comprises:
means for selecting the second IL divider and a first auxiliary divider associated with the first IL divider when the second IL divider is being calibrated, and
means for calibrating the second IL divider based on a second target frequency of the second IL divider.

26. The apparatus of claim 25, further comprising:
means for selecting the first auxiliary divider and a second auxiliary divider associated with the second IL divider when an oscillator is being calibrated; and
means for calibrating the oscillator based on a target oscillation frequency of the oscillator.

27. The apparatus of claim 25, further comprising:
means for selecting the first and second IL dividers during operation of a wireless device.

\* \* \* \* \*